United States Patent
Khan

(10) Patent No.: US 7,720,017 B2
(45) Date of Patent: May 18, 2010

(54) PARALLEL TURBO DECODERS WITH MULTIPLEXED OUTPUT

(75) Inventor: Safi Ullah Khan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 919 days.

(21) Appl. No.: 11/373,763

(22) Filed: Mar. 9, 2006

(65) Prior Publication Data
US 2006/0227815 A1 Oct. 12, 2006

Related U.S. Application Data

(60) Provisional application No. 60/660,967, filed on Mar. 11, 2005.

(51) Int. Cl.
*H04B 7/00* (2006.01)
(52) U.S. Cl. .................................. 370/310; 370/328
(58) Field of Classification Search ................ 370/310, 370/328, 329, 335; 375/E7.001, E7.026, 375/E7.226, E7.24
See application file for complete search history.

(56) References Cited

U.S. PATENT DOCUMENTS

| | | | | |
|---|---|---|---|---|
| 6,584,125 | B1 * | 6/2003 | Katto .......................... | 370/537 |
| 2002/0136332 | A1 * | 9/2002 | Dielissen et al. ............ | 375/341 |
| 2004/0190552 | A1 * | 9/2004 | Kim et al. ................... | 370/469 |

FOREIGN PATENT DOCUMENTS

| | | |
|---|---|---|
| EP | 0 973 292 A | 1/2000 |
| EP | 1 337 063 A | 8/2003 |
| EP | 1 501 229 A | 1/2005 |

OTHER PUBLICATIONS

Abbasfar, A et al: "Interleaver design for high speed turbo decoders" Proc. Wireless Communications and Networking Conference WCNC 2004, vol. 3, Mar. 21, 2004.

* cited by examiner

*Primary Examiner*—Chi H Pham
*Assistant Examiner*—Fan Ng
(74) *Attorney, Agent, or Firm*—Gerald P. Joyce, III

(57) ABSTRACT

A system and method are provided for parallel path turbo decoding in a portable wireless communications user terminal (UT). The method accepts a coded stream having a first order of information packets, and demultiplexes the coded stream into first coded and second coded information streams. The first coded stream is turbo decoded, generating a first decoded information stream. Likewise, the second coded stream is decoded to generate a second decoded information stream, asynchronously with respect to the first decoded stream. Then, the first and second decoded streams are combined into a combined stream having the first order of decoded information packets. The first and second decoded streams are combined by parallel buffering the first and second decoded streams, generating parallel-buffered decoded streams. Then, the parallel-buffered decoded streams are multiplexed to create a combined stream, which is stored in an output buffer.

19 Claims, 11 Drawing Sheets

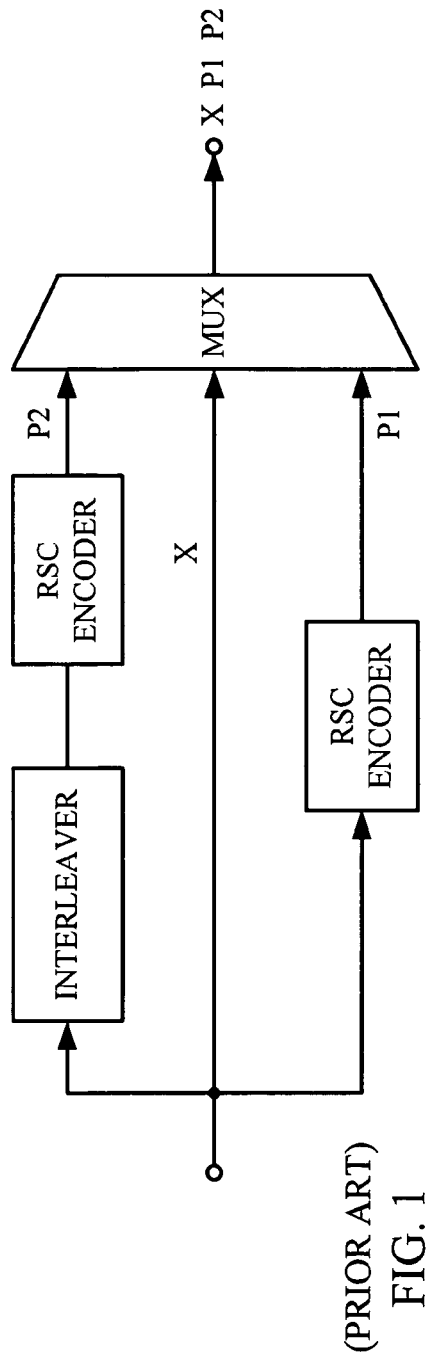
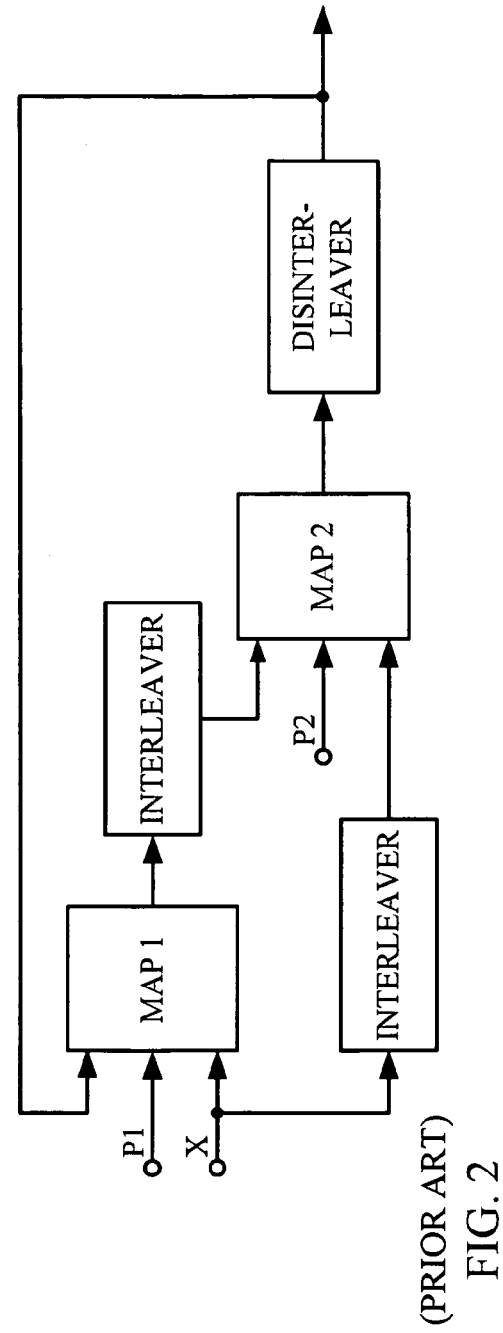
(PRIOR ART)
FIG. 1
(PRIOR ART)
FIG. 2

PARALLEL TURBO DECODERS WITH MULTIPLEXED OUTPUT

CLAIM OF PRIORITY UNDER 35 U.S.C. §119

The present Application for Patent claims priority to Provisional Application No. 60/660,967, filed Mar. 11, 2005, and assigned to the assignee hereof and hereby expressly incorporated by reference herein.

BACKGROUND

1. Field

The present invention generally relates to wireless communications and, more particularly, to a parallel turbo decoder system capable of asynchronous decoding and buffering parallel streams of information.

2. Background

FIG. 1 is a schematic block diagram depicting an example of a ⅓ parallel-concatenated turbo encoder (prior art). Turbo decoding is an iterative process that permits data error correction to be performed at near the Shannon limit. The ⅓ notation represents an implementation where one input bit stream is converted into a 3-component bit stream. The original data stream (x) passes to a multiplexer input, along with parity bit outputs (p1 and p2) from two parallel recursive systematic convolutional (RSC) encoders. An interleaver randomly arranges bits that are input into one of the RSC encoders. The multiplexer reassembles the three parallel input bit streams into an output serial stream (x p1 p2). Although a ⅓ turbo encoder is shown, ½, ¼, and ⅕ decoder are also known.

The turbo encoding is performed based upon the assumption that data will be degraded, due to noise, during transmission. On the receiver side of the transmission, a turbo decoder reconstructs the original bit stream by using a turbo trellis function to perform multiple search iterations.

FIG. 2 is a schematic block diagram of a turbo decoder (prior art). Each of the two maximum-a-posteriori (MAP) blocks generates extrinsic information. The extrinsic information represents the likelihood that a bit is either a "0" or a "1". One MAP block 202 receives the non-interleaved data x and first parity bit p1 as inputs, along with the disinterleaved output bit. A second MAP decoder receives the second parity bit p2, along with an interleaved version of the original data x. The second MAP calculates an extrinsic value based upon the extrinsic value from the first MAP and the second parity bit. The second MAP feeds its extrinsic value output to a disinterleaver, whose output is feed back to the first MAP for another iteration.

One pass through both the MAPs is considered an iteration. Multiple iterations through the system are required to generate a signal with a low bit-error ratio (BER). The iterative process gradually corrects errors, and given enough iterations, all the errors can be corrected.

Given the high data rates and amount of data to be processed, many real-time receivers are unable to use turbo decoding to correct all the errors in the data they receive. It would be advantageous if received data could be split into parallel data streams and parallel processed, to minimize the bottleneck associated with turbo decoding. However, this solution would present the additional problem of how to efficiently collect and recombine the data streams after they are decoded.

SUMMARY

The present invention describes a parallel turbo decoding system and method. The decoded data streams are recombined, in the proper order of data packets, in an output buffer. If the data is organized in different frame categories, then the recombined data streams can be stored in separate output buffers, one for each frame category. The system also generates various interrupts when turbo packets are stored in the output buffers.

When a packet is available and a turbo decoder is idle, the turbo decoder takes soft decision data from a bit metric (LLR) module. When the turbo-decoding operation is completed, hard decision bits are written to a corresponding mini output buffer. When a mini output buffer is full, data is transferred to an appropriate output buffer. The output buffers are drained by a microprocessor. The system manages the output buffers so that they can be simultaneously drained by the microprocessor, while being reprovisioned.

Accordingly, a method is provided for parallel path turbo decoding in a portable wireless communications user terminal (UT). The method accepts a coded stream having a first order of information packets, and demultiplexes the coded stream into first coded and second coded information streams. The first coded stream is turbo decoded, generating a first decoded information stream. Likewise, the second coded stream is decoded to generate a second decoded information stream, asynchronously with respect to the first decoded stream. Then, the first and second decoded streams are combined into a combined stream having the first order of decoded information packets (the order in which the packets were received).

The first and second decoded streams are combined by parallel buffering, and parallel-buffered decoded streams are generated. Then, the parallel-buffered decoded streams are multiplexed. More specifically, the first and second decoded streams are parallel buffered by storing the first decoded stream in a first mini buffer, and storing the second decoded stream in a second mini buffer. Outputs from the first and second mini buffers are multiplexed to create a combined stream, and the combined stream is stored in an output buffer.

In some aspects the coded input stream is organized into a superframe with a plurality of frames, where each frame includes ordered information packets. Then the first and second decoded streams are combined into a plurality of combined streams, where each combined stream includes ordered information packets corresponding to a frame category. Each combined stream is stored in a separate output buffer.

Additional details of the above-described method, and a system for parallel path turbo decoding in a portable wireless communications user terminal are provided below.

BRIEF DESCRIPTION OF THE DRAWINGS

FIG. 1 is a schematic block diagram depicting an example of a ⅓ parallel-concatenated turbo encoder (prior art).

FIG. 2 is a schematic block diagram of a turbo decoder (prior art).

DETAILED DESCRIPTION

Figure 3A:
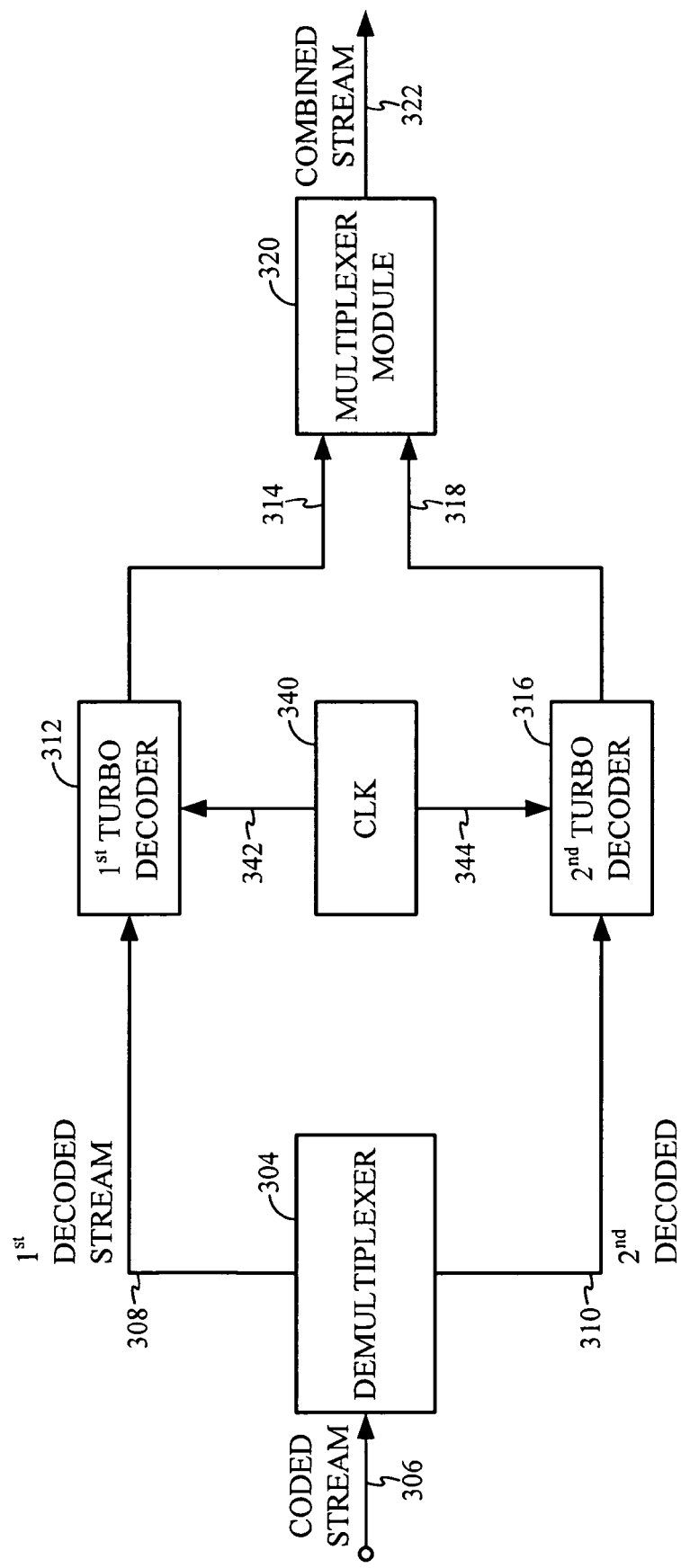
FIG. 3A is a schematic block diagram of a portable wireless communications user terminal (UT), with a system for parallel path turbo decoding.

FIG. 3A is a schematic block diagram of a portable wireless communications user terminal (UT) 300, with a system for parallel path turbo decoding. The system 302 comprises a demultiplexer 304 having an input on line 306 to accept a coded stream. The coded stream is composed of ordered information packets. For example, the information packets are arranged in a first order. The demultiplexer 304 has an output on line 308 to supply a first coded stream of demultiplexed information, and an output on line 310 to supply a second coded stream of demultiplexed information. For simplicity, a demultiplexer is shown. However, in other aspects the two coded input streams may be outputs from a receiver.

Figure 4:
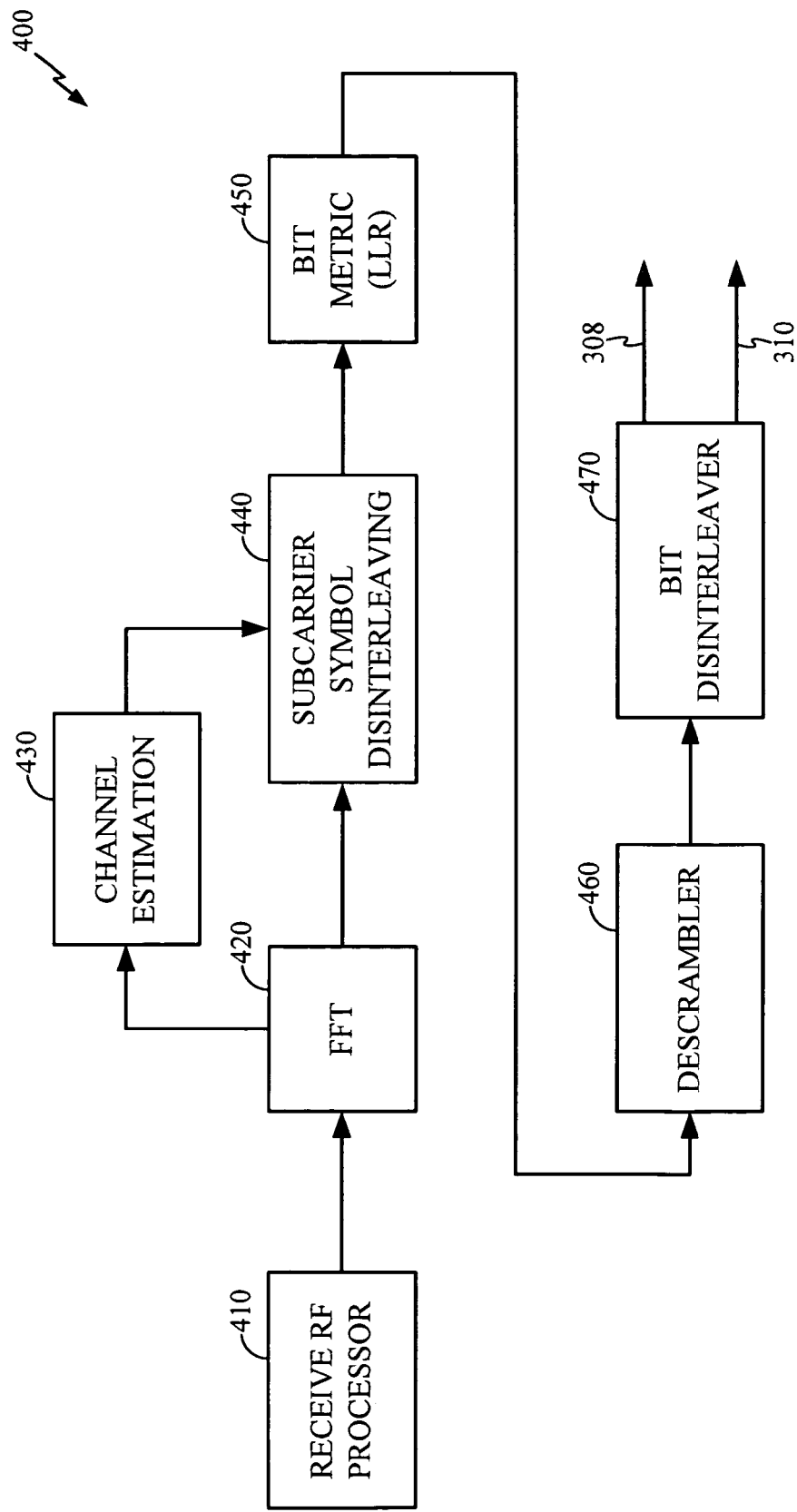
FIG. 4 is a schematic block diagram of an exemplary UT receiver.

FIG. 4 is a schematic block diagram of an exemplary UT receiver. The receiver 400 includes a receive RF processor 410 configured to receive transmitted RF OFDM symbols, process them, and frequency convert them to baseband OFDM symbols or substantially baseband signals. A signal can be referred to as substantially a baseband signal if the frequency offset from a baseband signal is a fraction of the signal bandwidth, or if signal is at a sufficiently low intermediate frequency to allow direct processing of the signal without further frequency conversion. The OFDM symbols from the receive RF processor 410 are coupled to an FFT module 420 that is configured to transform the OFDM symbols to the hierarchically modulated frequency domain subcarriers.

The FFT module 420 can be configured to couple one or more subcarriers, such as predetermined pilot subcarriers, to a channel estimator 430. The pilot subcarriers can be, for example, one or more equally spaced sets of OFDM subcarriers. The channel estimator 430 is configured to use the pilot subcarriers to estimate the various channels that have an effect on the received OFDM symbols. In one embodiment, the channel estimator 430 can be configured to determine a channel estimate corresponding to each of the subcarriers. The channel estimates at a particular subcarrier can be used as a channel estimate for adjacent subcarriers, for example, those subcarriers within a predetermined coherence bandwidth of the pilot subcarrier.

The subcarriers from the FFT module 420 and the channel estimates are coupled to a subcarrier symbol deinterleaver 440. The symbol deinterleaver 440 can be configured to reverse the symbol mapping performed by a transmitter (not shown).

The bit metric module 450 can operate on the modulated tone to determine a metric indicative of the quality of the received symbol. In one aspect, where the symbols are turbo coded, the bit metric module 450 can be configured to determine a log likelihood ratio (LLR) of the received symbol. The LLR is the logarithm of the likelihood ratio. The ratio can be defined as the probability that the original bit is 1 over the probability that the original bit is equal to 0. Alternatively, the ratio can be defined in a reverse way, where the LLR is the probability that the original bit is 0 over the probability that the original bit is equal to 1. There is no substantial difference between these two definitions. The bit metric module 450 can use, for example, the symbol magnitudes and the channel estimate to determine the LLR values.

The metric module 450 utilizes a channel estimate and a received signal to determine a LLR value. A noise estimate may also be used. However, the noise estimate term can be substantially ignored if a turbo decoding method that provides the same results regardless of the noise estimate is used. In such an embodiment, the bit metric module 450 hardware can use a predetermined value as the noise estimate in calculating LLR values.

The output of the base bit metric module 450 is coupled to a base layer processor descrambler 460, configured to operate on the received LLR values to reverse the symbol scrambling performed in the encoder. The output of the symbol descrambler 460 is coupled to a bit disinterleaver 470 that is configured to disinterleave the previously interleaved symbols. As shown in this aspect, the descrambler output disinterleaves into two bit streams 308 and 310, which are coupled to the turbo decoders of FIG. 3A.

Returning to FIG. 3A, a first turbo decoder 312 has an input on line 308 to accept the first coded stream and an output on line 314 to supply a first decoded stream of information. A second turbo decoder 316 has an input on line 310 to accept the second coded stream, and an output on line 318 to supply a second decoded stream of information. The second decoded stream is asynchronously generated with respect to the first decoded stream.

A multiplexing module 320 has inputs to accept the first and second decoded streams on lines 314 and 318, respectively. The multiplexing module 320 combines the first and second decoded streams, and supplies a combined stream at an output on line 322. The combined stream is composed of ordered decoded information packets. For example, the decoded information packets are organized in the first order, the order in which the coded information packets were received by the demultiplexer 304.

Figure 3B:
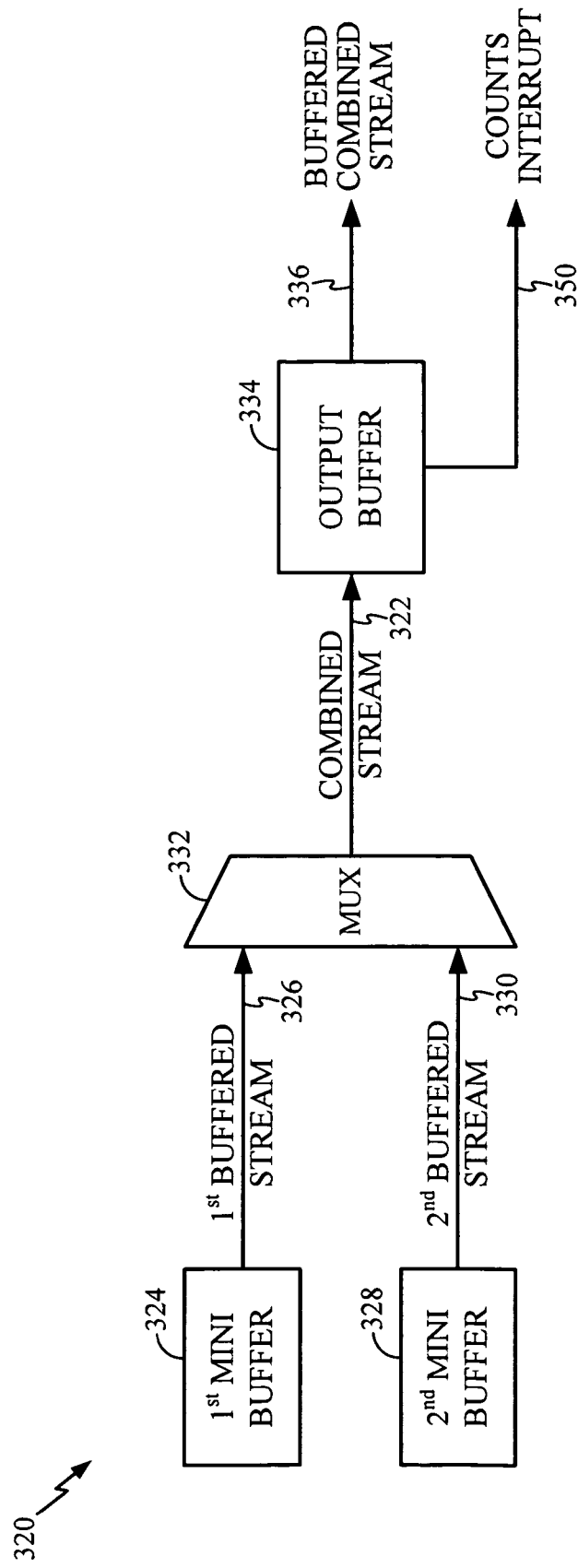
FIG. 3B is a first exemplary depiction showing details of the multiplexing module of FIG. 3A.

FIG. 3B is a first exemplary depiction showing details of the multiplexing module of FIG. 3A. The multiplexing module 320 typically includes a first mini buffer 324 having an input on line 314 to accept the first decoded stream, and an output on line 326 to supply a first buffered stream. A second mini buffer 328 has an input on line 318 to accept the second decoded stream, and an output on line 330 to supply a second buffered stream. A multiplexer (MUX) 332 has inputs on lines 326 and 330 to accept the first and second buffered streams, respectively, and an output on line 322 to supply the combined stream.

The multiplexing module 320 may further include an output buffer 334 having an input on line 322 to accept the combined stream and an output on line 336 to supply a buffered combined stream.

Returning to FIG. 3A, a clock (CLK) 340 has outputs on lines 342 and 344 to selectively supply a first clock signal and a second clock signal, respectively. The first turbo decoder 312 decodes the first coded stream in response to receiving the first clock signal, and the second turbo decoder 316 decodes the second coded stream in response to receiving the second clock signal. The clock 340 interrupts the supply of the first clock signal in response to the demultiplexer 304 ceasing to supply the first coded stream. Likewise, the clock 340 interrupts the supply of the second clock signal in response to the demultiplexer ceasing to supply the second coded streams. In this manner, the decoders need not be clocked if there is no data to decode. It is widely known that dynamic power consumption of CMOS circuits can be significantly reduced by selectively interrupting the clock. The independent clock signals help enable the asynchronous decoder functionality.

Figure 5:
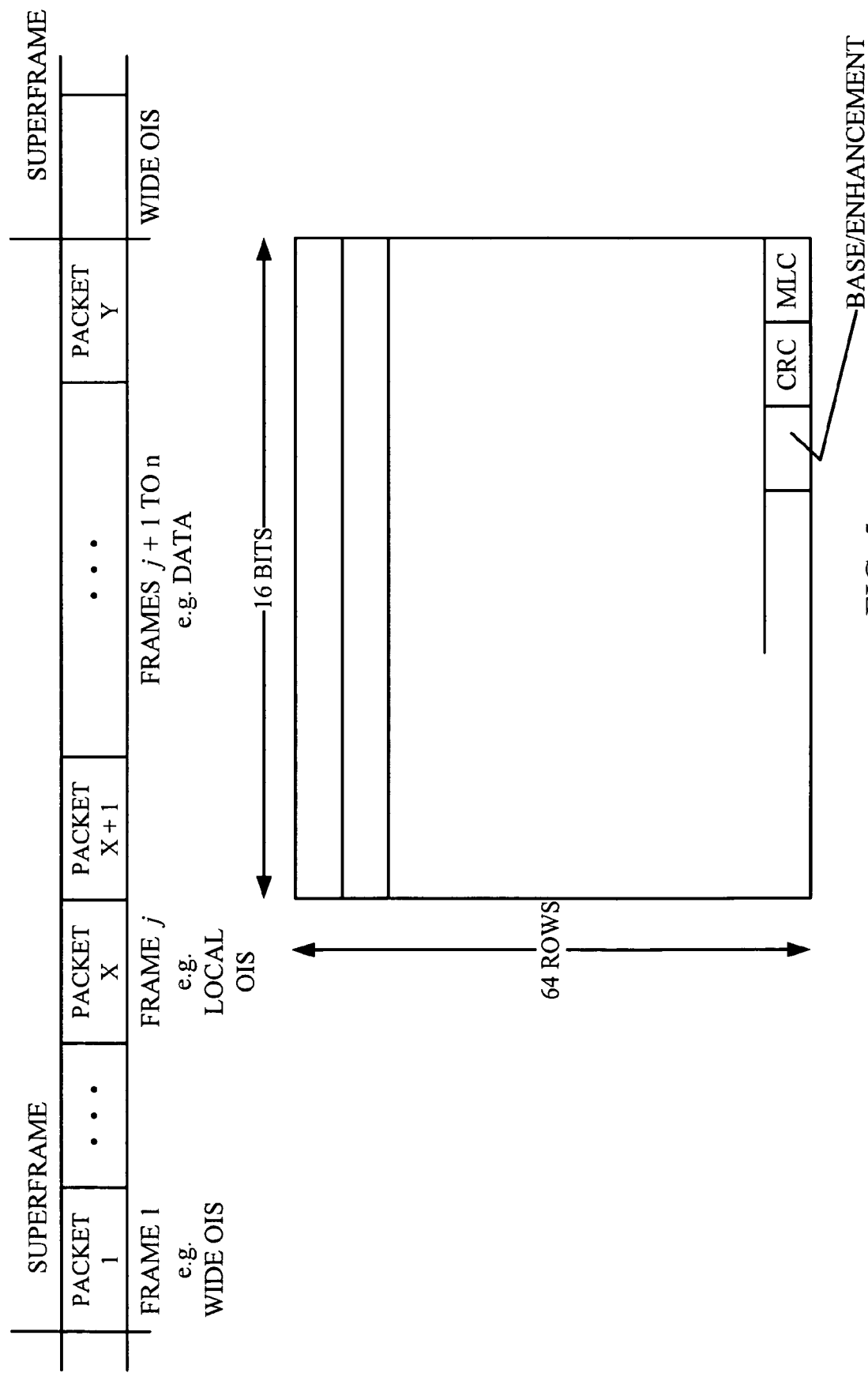
FIG. 5 is a drawing depicting the organization of information packets into a superframe.

FIG. 5 is a drawing depicting the organization of information packets into a superframe. Each superframe is made up of a plurality of frames. In one aspect there are 4 main data frames, 1 Wide Overhead Information Symbols/System (OIS) frame, and 1 Local OIS frame (n=6 and j=2). Each frame includes a plurality of ordered packets (turbo packets). In one aspect, the Wide and Local OIS frames each include 7 packets, and the 4 main data frames typically hold many more than 7 packets. However, a superframe is not limited to any particular number of frames, and a frame is not limited to any particular number of packets. When the coded information stream is organized as a superframe, the multiplexer module (320 of FIG. 3B) supplies a plurality of combined streams, as described in more detail below, where each combined stream includes ordered information packets corresponding to a frame category. In this example there are three frame categories: Data, Wide OIS, and Local OIS. Using the above example, the multiplexer module supplies a combined data stream, combined Wide OIS stream, and a combined Local OIS stream, where the decoded packets are combined in the order in which they were received as coded information packets.

Figure 6:
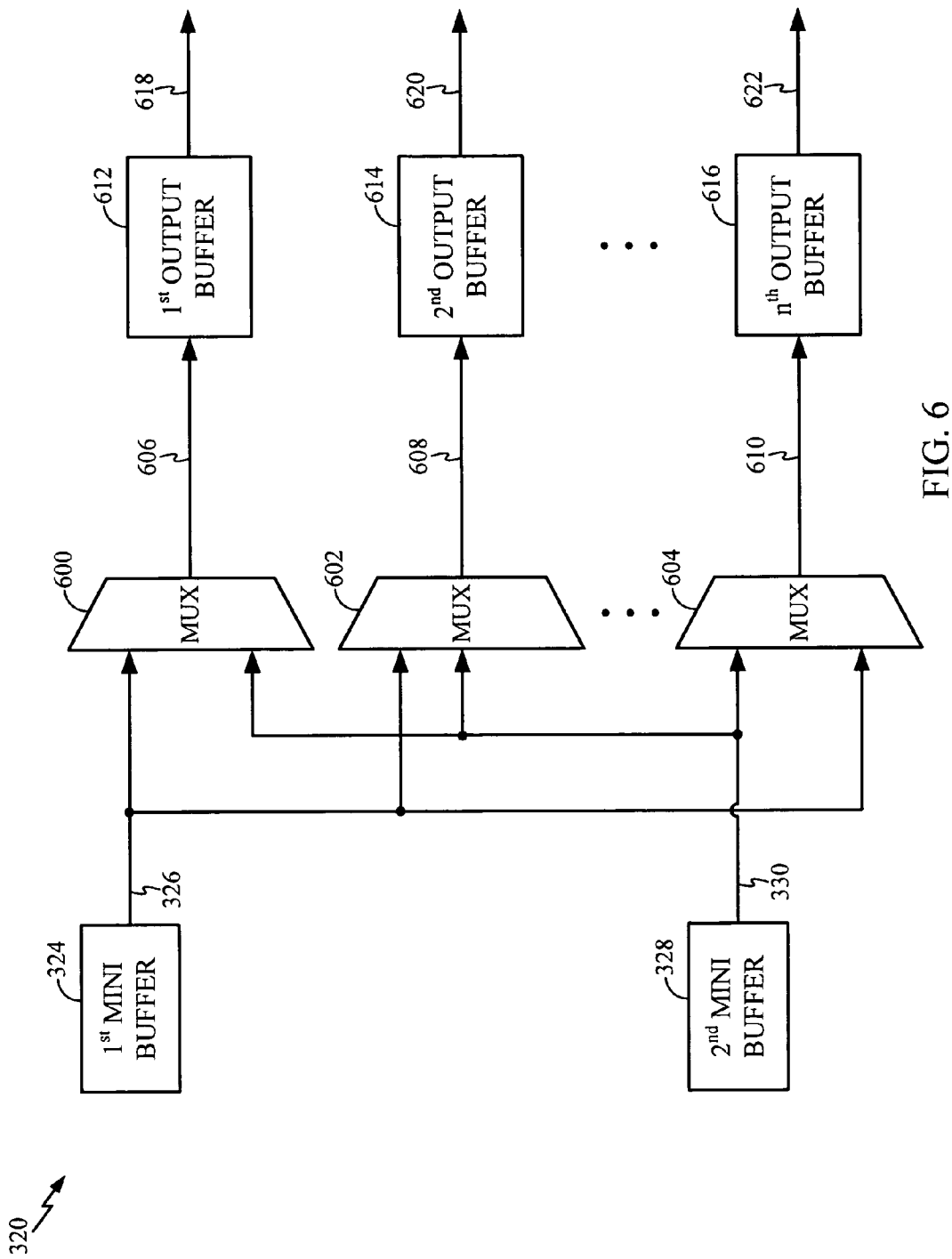
FIG. 6 is a second exemplary depiction showing details of the multiplexing module of FIG. 3A.

FIG. 6 is a second exemplary depiction showing details of the multiplexing module of FIG. 3A. Viewing FIGS. 3A, 5, and 6, the demultiplexer 304 accepts the coded stream as a superframe with a plurality of frames, where each frame includes ordered information packets. For example, information packets are shown in the main (Data) frame category, organized in the first order (x+1 through y). In this aspect, the multiplexer module 320 includes a multiplexer for each frame category. The superframe is shown with three frame categories (Data, Local OIS, and Wide OIS). Therefore, the multiplexer module 320 is shown with three multiplexers. However, the invention is not limited to any particular number of frame categories (multiplexers). Each multiplexer 600, 602, and 604 has inputs to accept the first and second buffered streams on lines 326 and 330, respectively. Multiplexers 600, 602, and 604 have outputs 606, 608, and 610, respectively, to supply combined streams of ordered information packets for a corresponding frame category. The multiplexer module 320 also includes an output buffer for each frame category. Each output buffer 612, 614, and 616 has an input to accept one of the combined streams. Buffers 612, 614, and 616 have outputs 618, 620, and 622, respectively, to supply a buffered combined stream for a corresponding frame category.

Considering either FIG. 3B or FIG. 6, the output buffers (i.e., buffer 334) supplies packets from the buffered combined stream simultaneously with loading packets from the combined stream. In one aspect, the output buffer 334 has an output on line 350 to supply a count of decoded information packets stored in the output buffer. In other aspects, the output on line 350 can be configured to supply an interrupt signal to a microprocessor (not shown) responsible for draining the buffer. The interrupt signal can be generated in response to the buffer reaching a predetermined (watermark) output buffer capacity level, the storing an end of frame packet, or storing an end of data burst packet, where a data burst is a logical organization of information packets lasting longer than an OFDM symbol (e.g., a MediaFLO logical channel or MLC). Although not specifically shown, the buffers of FIG. 6 can also be enabled with outputs to supply packet count and interrupt information.

Figure 7:
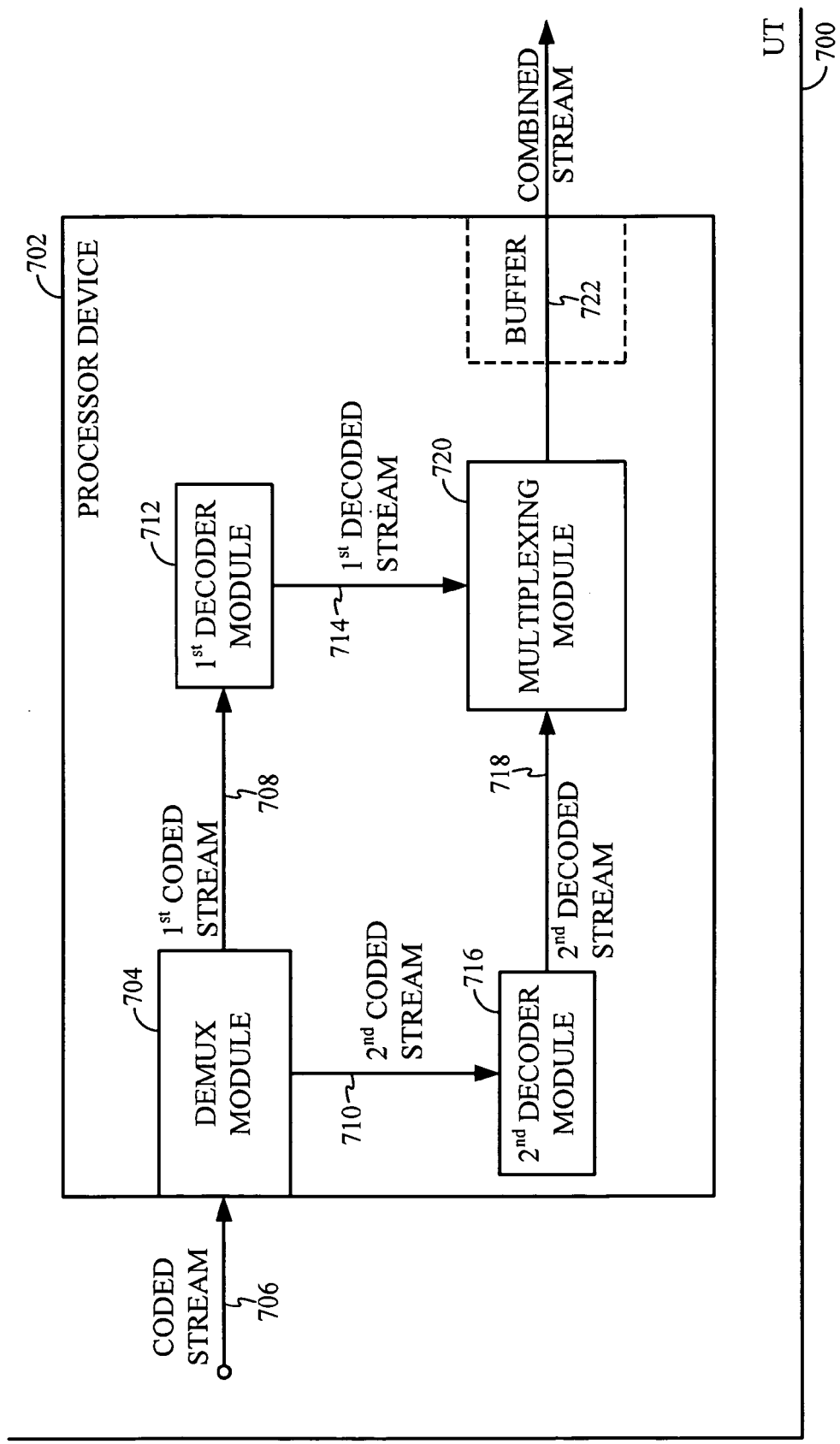
FIG. 7 is a schematic block diagram depicting a processor device for parallel path turbo decoding in a portable wireless communications UT.

FIG. 7 is a schematic block diagram depicting a processor device for parallel path turbo decoding in a portable wireless communications UT 700. The processor device 702 comprises a demultiplexer module 704 having an input on line 706 to accept a coded stream having a first order of information packets. The demultiplexer (deMUX) module 704 has an output on line 708 to supply a first coded stream of demultiplexed information, and an output on line 710 to supply a second coded stream of demultiplexed information.

A first turbo decoder module 712 has an input on line 708 to accept the first coded stream and an output on line 714 to supply a first decoded stream of information. A second turbo decoder module 716 has an input on line 710 to accept the second coded stream, and an output on line 718 to supply a second decoded stream of information, which is asynchronously generated with respect to the first decoded stream. A multiplexing module 720 has an input on lines 714 and 718 to accept the first and second decoded streams, respectively. The multiplexing module 720 combines the first and second decoded streams, and has an output on line 722 to supply a combined stream having the first order of decoded information packets. In one aspect not shown, the combined stream is buffered.

Figure 8:
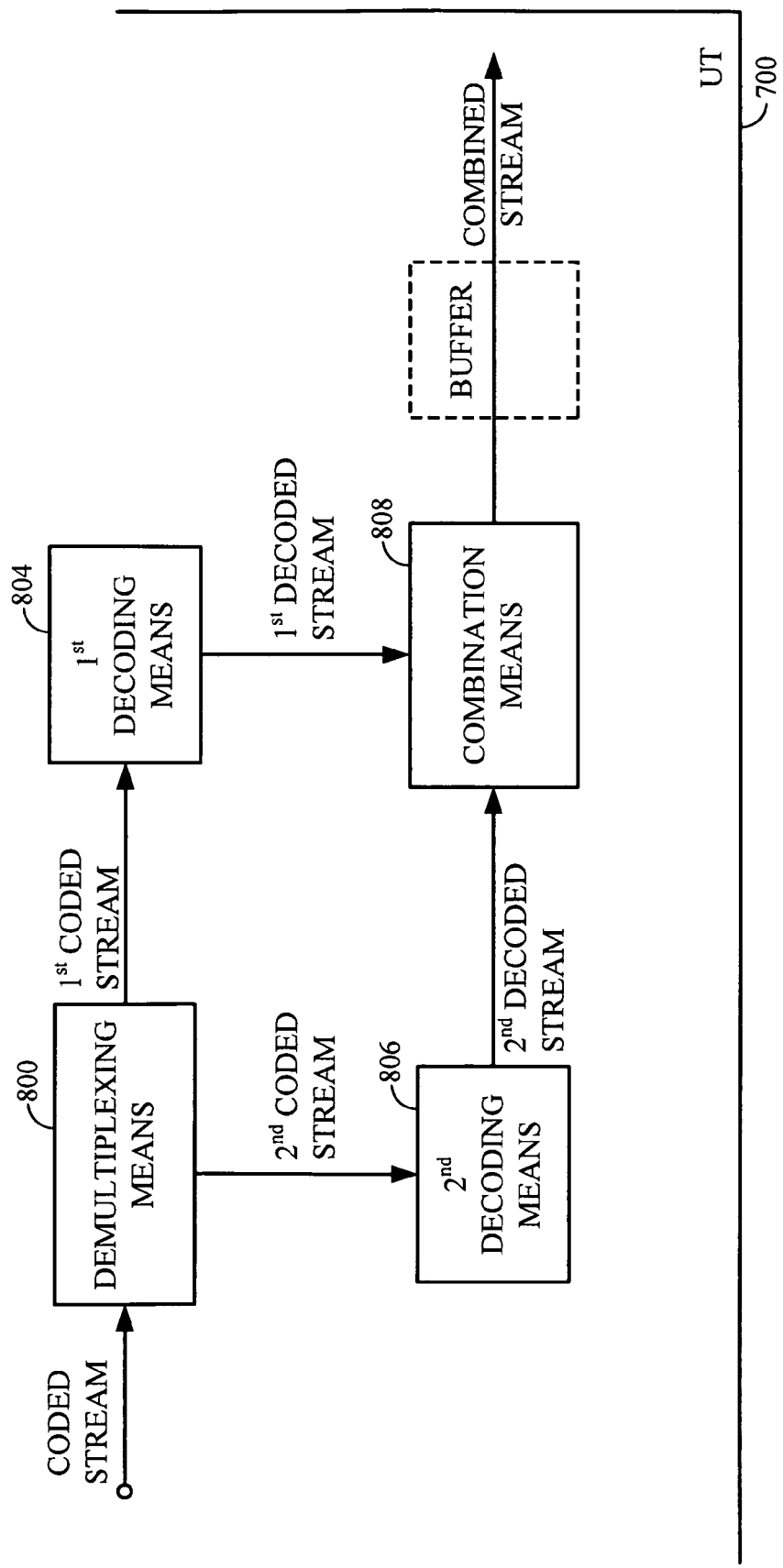
FIG. 8 is a schematic block diagram depicting a variation of the system for parallel path turbo decoding in a portable wireless communications UT.

FIG. 8 is a schematic block diagram depicting a variation of the system for parallel path turbo decoding in a portable wireless communications UT. The system 800 comprises a demultiplexing means 802 to accept a coded stream having a first order of information packets. The demultiplexing means 802 supplies a first coded stream of demultiplexed information and a second coded stream of demultiplexed information. A first turbo decoding means 804 accepts the first coded stream and supplies a first decoded stream of information. A second turbo decoding means 806 accepts the second coded stream and supplies a second decoded stream of information, asynchronously generated with respect to the first decoded stream. A combination means 808 accepts the first and second decoded streams, combines the first and second decoded streams, and supplies a combined stream having the first order of decoded information packets. In some aspects not shown, a buffer means stores (buffers) the combined stream.

Functional Description

Figure 9:
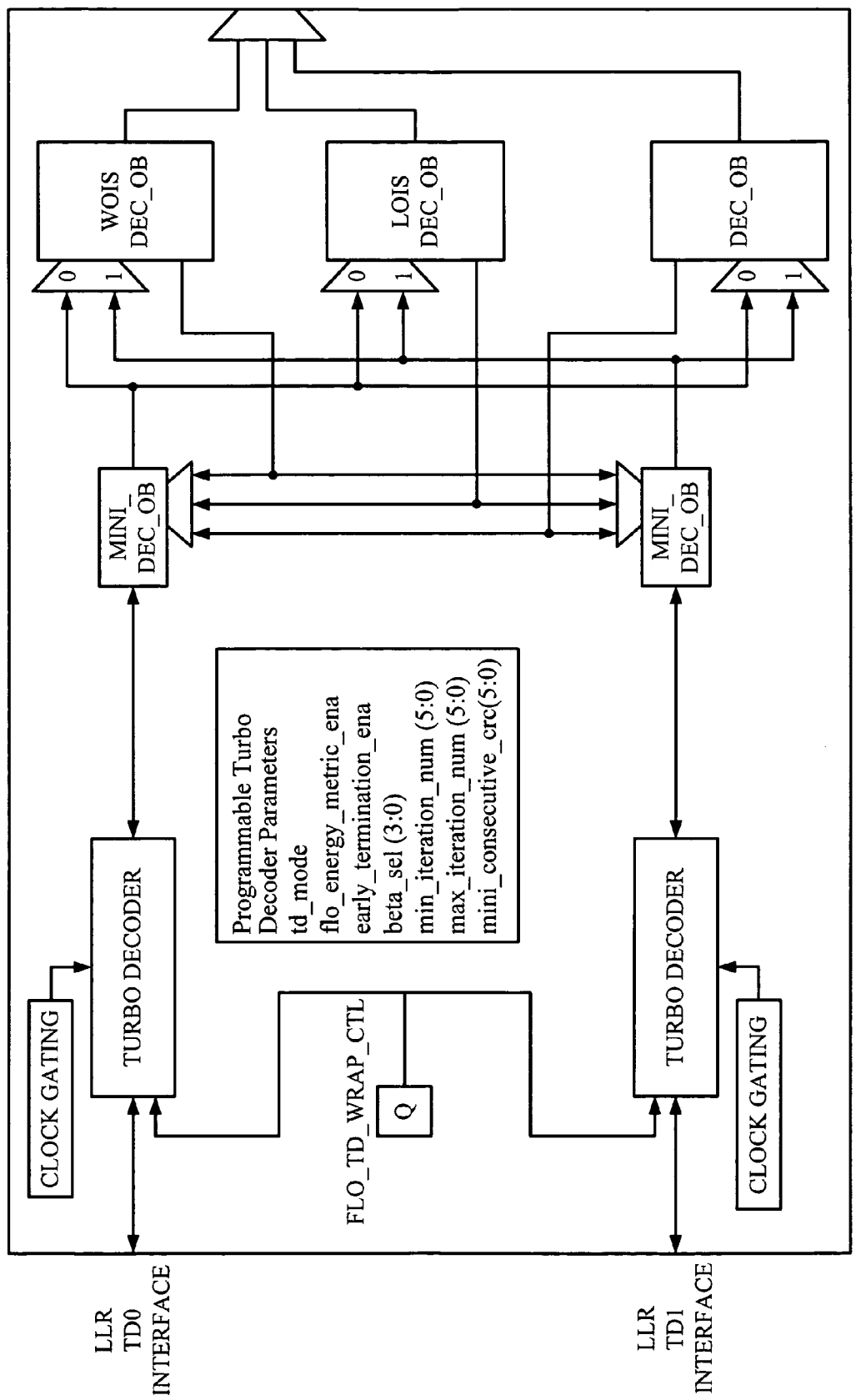
FIG. 9 is a more detailed depiction of the exemplary parallel decoding system of FIGS. 3A and 6.

FIG. 9 is a more detailed depiction of the exemplary parallel decoding system of FIGS. 3A and 6. Shown are two turbo decoders, and two mini output buffers, each dedicated to one of the turbo decoders. One Wide OIS output buffer, one Local OIS output buffer, and one Data output buffer. The system manages to write packets from two turbo decoders to the three output buffers. The system also manages arbitration and collision handling when a microprocessor access (buffer draining) occurs simultaneously with an internal hardware access (buffer loading). Various interrupts can be generated when turbo packets are stored in output buffers.

When a packet is available and a turbo decoder is idle, the turbo decoder takes soft decision data from the LLR. Following the turbo-decoding operation, hard decision bits are written to the corresponding mini output buffer. When a mini output buffer is full, data is transferred to the appropriate output buffer. In one aspect, the output buffers are 16-bit wide Random Access Memories (RAMs) that are drained by a microprocessor (not shown).

The turbo decoders may be enabled to support $\frac{1}{2}$, $\frac{1}{3}$, $\frac{2}{3}$, and $\frac{1}{5}$ code rates. The turbo decoders interface to an LLR block, where the soft decision bits are stored in the turbo decoder iteration buffer memories. The output buffers are typically large enough to store an entire packet. For example, a typical buffer may store the following information for every packet: 994 decoded bits from the turbo decoder; 8 bits of the data burst identity (i.e., MediaFLO Logical Channel (MLC) ID); 1 bit for Cyclic Redundancy Check (CRC) erasure indicator; and, 1 bit for base/enhancement layer indicator. Since the exemplary RAM is 16 bits wide, to pack these bits into a 16-bit-wide interface, each packet is 64 locations deep.

The memory requirements for the data output buffer are derived from the maximum data rate supported. It should be understood that not all frames carry the same number of packets, and not all frame categories carry the same number of frames. Therefore, the Data buffer may be larger than other Wide and Local OIS buffers. Assuming that the maximum turbo decoder throughput is four packets per OFDM symbol, and the maximum interrupt latency of the receiver software is 10 ms, which corresponds to 12 OFDM symbols. Then, the amount of data stored per packet is kbit, and the data output buffer should be at least 4×12×1 kb=48 kb.

The microprocessor may read from any of the output buffers when it receives a watermark interrupt. If the watermark of the data output buffer is set at 50%, the 48 kb can arrive before the microprocessor responds to a watermark interrupt. Therefore, 48 kb should correspond to 50% of required size of the data output buffer. That is, the data output buffer should be 96 kb. If the 96 kb buffer is organized in the hardware as a [6144×16] RAM, and each packet is 64 locations deep, then the buffer holds 96 packets.

The Wide and Local OIS packets are stored in separate output buffers for quick microprocessor access to overhead information contained in these packets. If the Wide and local OIS data always consist of seven packets each, and using the same requirements for each turbo packet as data buffer above, each packet requires 64 locations. As a result, one 448×16 RAMs is required each of the Wide and Local OIS buffers.

The output buffers generate an interrupt if a watermark threshold is reached, ensuring that the buffer is drained to prevent data loss. The watermark level is software programmable. The output buffers can be enabled to provide the microprocessor with a count of the number of packets in the buffer, so the correct number of packets can be drained. For the Wide and Local OIS output buffers, the microprocessor drains seven packets. Wide and Local OIS output buffer interrupts can also be generated when the $7^{th}$ packet has been stored in RAM.

An interrupt can also be generated by an output buffer when the number of stored packets exceed an overflow condition, indicating that data has been lost. An interrupt can be generated when the last packet of a frame has been stored, or when the last packet in a data burst (i.e., MLC) is stored.

Each turbo decoder has a dedicated mini output buffer (mini_dec_ob). The mini output buffers are designed so that when a turbo decoder finishes writing a packet into its mini_dec_ob, the second turbo decoder can simultaneously write to its mini_dec_ob, and data from the both mini_dec_ob can then quickly be transferred by hardware in 64 chipx8 clocks from either mini_dec_ob to one of the three output buffers. This approach reduces latency and allows both turbo decoders to continue processing packets.

Figure 10:
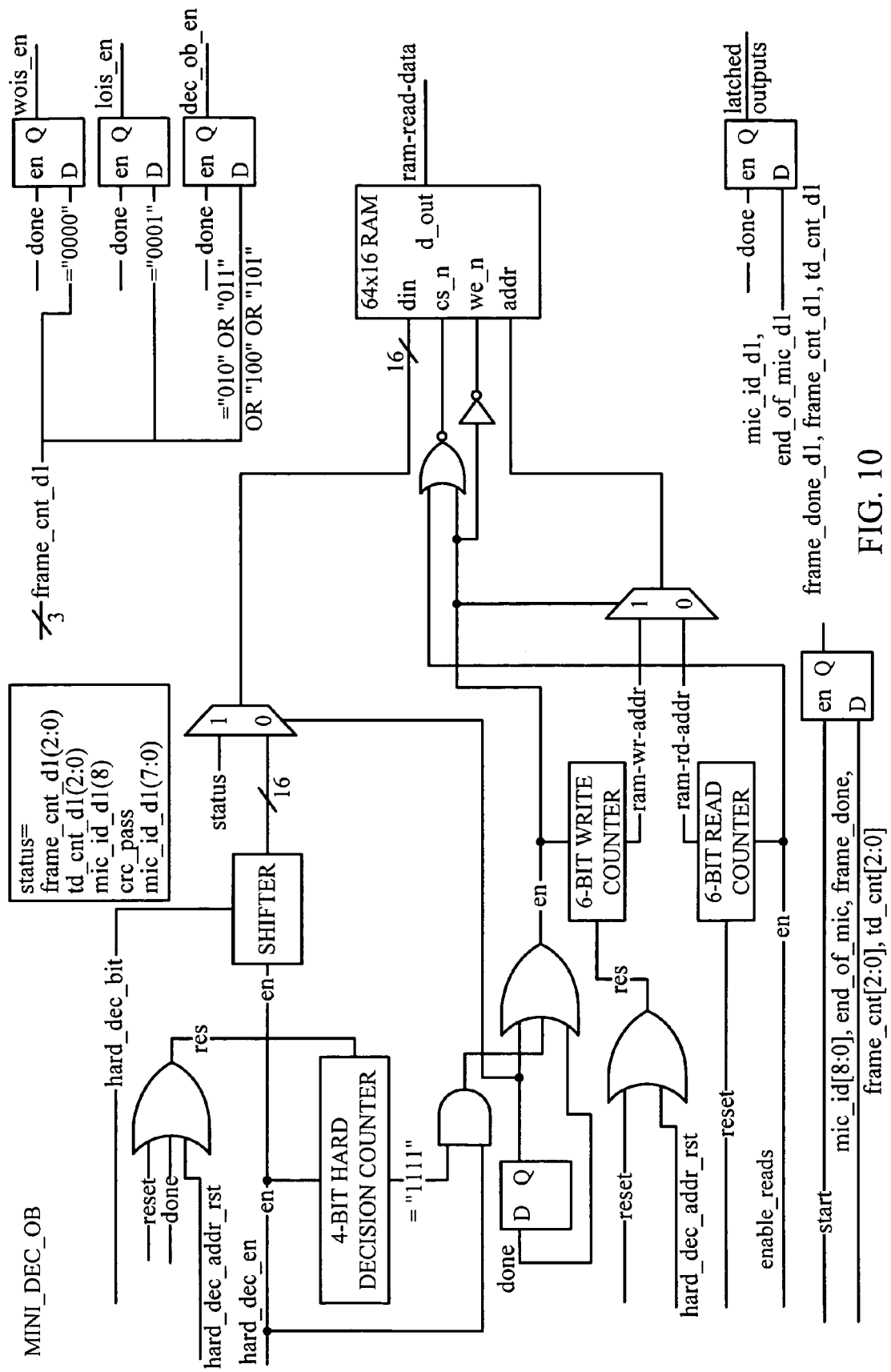
FIG. 10 is a schematic block diagram of an exemplary mini buffer.

FIG. 10 is a schematic block diagram of an exemplary mini buffer. Each mini_dec_ob decoder output buffer has one 64×16 RAM. This RAM is written to by the Turbo Decoder and read by wois_dec_ob, lois_dec_ob, and dec_ob. Internal address pointers track the addresses. After every read from one of the output buffers, the internal address pointer is auto-incremented, so the next read by the output buffer points to the next address location and so on. The address pointer is incremented as the turbo decoder writes data to the RAM and is decremented when an output buffer reads data out of the RAM.

The turbo decoder generates 994 hard-decision bits, one at a time, for each exemplary packet described above. The bits are stored in the input shift register. At every $16^{th}$ hard-decision bit, the 16-bit value is written into the RAM at the location pointed to by the write address pointer. The write address pointer initially starts from zero and increments by one. This process continues as long as the turbo decoder generates output data. The address pointer is 6-bits wide; after writing one packet (64 locations), the address pointer rolls over to zero. The read pointer is always behind the write pointer.

At the end of every turbo packet, after all the hard-decision bits are stored, the turbo decoder issues a done signal to indicate to the output buffer that the packet has been decoded. At this point, the MLC ID of this packet, the CRC erasure bit, and the base/enhancement bit can be stored (see FIG. 5). This information is stored in the $64^{th}$ RAM location for every packet.

At the start of every turbo packet, the mini_dec_ob also captures other information for each packet and updates this information at its outputs in response to the done signal. This information includes: frame_done, end_of_mlc, frame_cnt, and td_cnt. The LLR block sends this information at every start of packet. This information is latched on start and held in registers until the next start. At done, this information is passed to the wois_dec_ob, lois_dec_ob, or dec_ob after each packet, so the correct interrupt can be generated when the respective condition is true for that packet. For example, when mini_dec_ob processes the last turbo packet in a frame, frame_done will be set. When the dec_ob transfers this packet into its RAM, it assets frame_done_irq interrupt to indicate that the last turbo packet for this frame is ready in the output buffer.

The done signal from a turbo decoder triggers the start of the transfer from its mini_dec_ob to one of the main output buffers. Data is read out from the RAM by the output buffer. There is an associated read address pointer, which is also 6-bits wide and starts from zero. After every read by the output buffer, this pointer increments by one. This pointer also rolls over after reading one packet (64 locations).

Figure 11:
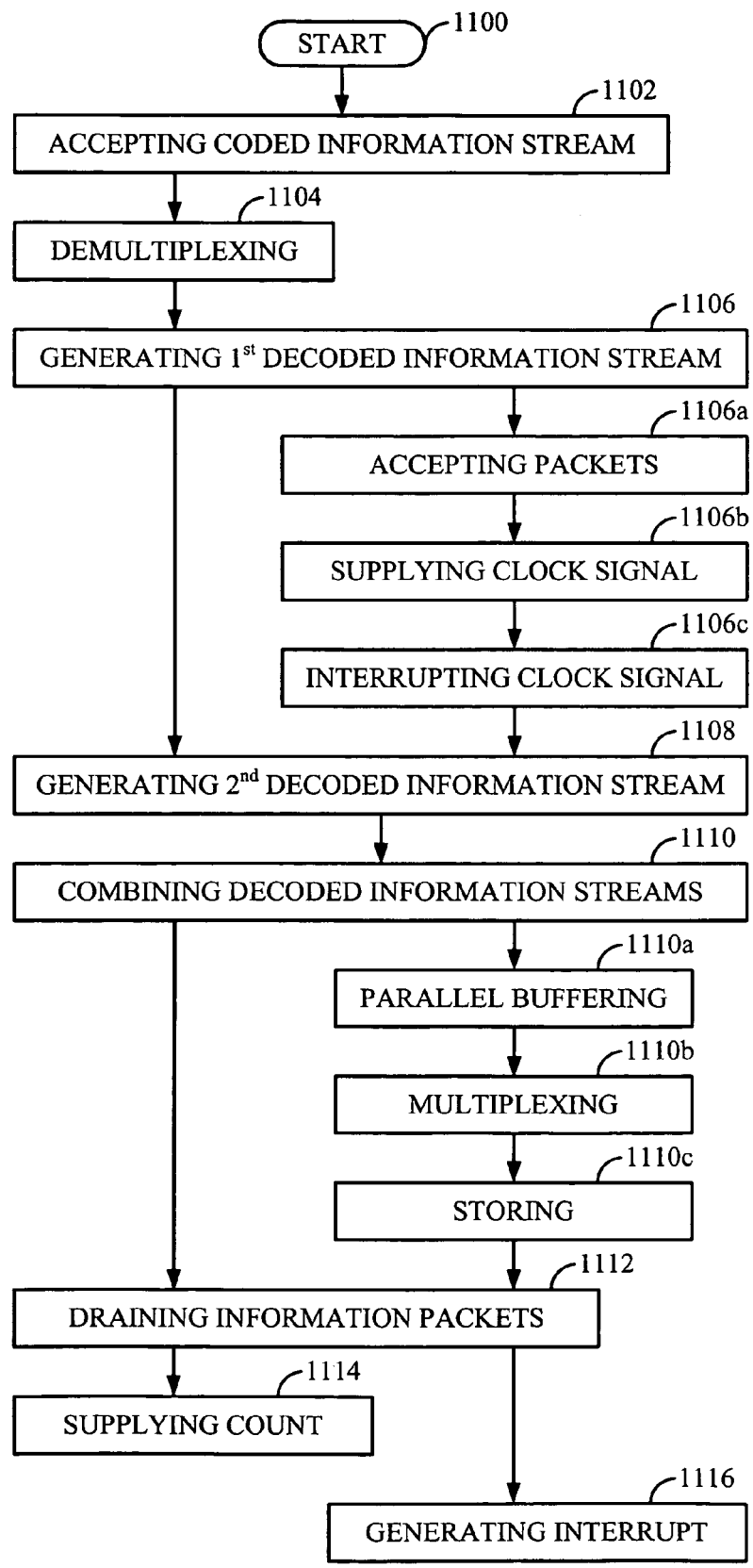
FIG. 11 is a flowchart illustrating a method for parallel path turbo decoding in a portable wireless communications UT.

FIG. 11 is a flowchart illustrating a method for parallel path turbo decoding in a portable wireless communications UT. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 accepts a coded stream having a first order of information packets. Step 1104 demultiplexes the coded stream into first coded and second coded information streams. Step 1106 turbo decodes the first coded stream, generating a first decoded information stream. Step 1108 turbo decodes the second coded stream, generating a second decoded information stream, asynchronously with respect to the first decoded stream. Step 1110 combines the first and second decoded streams into a combined stream having the first order of decoded information packets.

In one aspect, combining the first and second decoded streams in Step 1110 includes substeps. Step 1110a parallel buffers the first and second decoded streams, generating parallel-buffered decoded streams. Step 1110b multiplexes the parallel-buffered decoded streams. Parallel buffering the first and second decoded streams in Step 1110a may include substeps (not shown). Step 1110a1 stores the first decoded stream in a first mini buffer. Step 1110a2 stores the second decoded stream in a second mini buffer. Then, multiplexing the parallel-buffered decoded streams in Step 1110b includes multiplexing outputs from the first and second mini buffers to create the combined stream. In another aspect, Step 1110c stores the combined stream in an output buffer.

In a different aspect, accepting the coded stream in Step 1102 includes accepting a superframe with a plurality of frames, where each frame includes ordered information packets. Then, combining the first and second decoded streams in Step 1110 includes combining the first and second decoded streams of into a plurality of combined streams, where each combined stream includes ordered information packets corresponding to a frame category. Likewise, Step 1110 may store each combined stream in a separate output buffer.

In another aspect, Step 1112 drains the information packets from the combined stream in the output buffer. Then, storing the combined stream in the output buffer (Step 1110c) may store information packets simultaneously with the draining of information packets from the combined stream.

In a different aspect, Step 1114 supplies a count of combined stream information packets stored in the output buffer. Step 1116 generates an interrupt signal in response to an action such as reaching a predetermined (watermark) output buffer capacity level, storing an end of frame packet, or storing an end of data burst (MLC) packet.

In another aspect, turbo decoding the first stream of coded information in Step 1106 includes substeps. Step 1106a accepts coded information packets at a first turbo decoder. In response to receiving the information packets, Step 1106b supplies a clock signal to the first turbo decoder. Subsequent to turbo decoding the information packets, Step 1106c interrupts the supply of the clock signal to the first turbo decoder. Although not specifically shown, the same substeps apply to turbo decoding the second stream (Step 1108).

FIG. 11 can alternately be understood to represent operations in a signal bearing medium tangibly embodying a program of machine-readable instructions executable by a digital processing apparatus to perform parallel path turbo decoding in a portable wireless communications UT.

A system and method have been provided for parallel path turbo decoding. The invention has been illustrated in the context of specific types of modulation formats and data organization. However, the invention is not necessary limited to these examples. For example, while three output buffers have been depicted, the invention is not necessarily limited to this number. Likewise, although two turbo decoders are shown, the invention is not necessarily so limited. Other variations and embodiments of the invention will occur to those skilled in the art.

What is claimed is:

1. In a portable wireless communications user terminal (UT), a method for parallel path turbo decoding, the method comprising:
   accepting a coded stream having a first order of information packets;
   demultiplexed the coded stream into first coded and second coded information streams;
   turbo decoding the first coded stream, generating a first decoded information stream;
   turbo decoding the second coded stream, generating a second decoded information stream, asynchronously with respect to the first decoded stream;
   combining the first and second decoded streams into a combined stream having the first order of decoded information packets; and
   selectively supplying a clock signal to enable at least the turbo decoding of the first coded stream, wherein the clock signal is supplied when the first coded stream having information packets to be decoded is supplied and is interrupted when the first coded stream is not supplied.

2. The method of claim 1 wherein combining the first and second decoded streams includes:
   parallel buffering the first and second decoded streams, generating parallel-buffered decoded streams; and,
   multiplexing the parallel-buffered decoded streams.

3. The method of claim 2 wherein parallel buffering the first and second decoded streams includes:
   storing the first decoded stream in a first mini buffer; and,
   storing the second decoded stream in a second mini buffer.

4. The method of claim 3 wherein multiplexing the parallel-buffered decoded stream includes multiplexing outputs from the first and second mini buffers to create to combined stream; and,
   storing the combined stream in an output buffer.

5. The method of claim 4 wherein accepting the coded stream includes accepting a superframe with a plurality of frames, where each frame includes ordered information packets; and,
   wherein combining the first and second decoded streams includes combining the first and second decoded streams of into a plurality of combined streams, where each combined stream includes ordered information packets corresponding to a frame category.

6. The method of claim 5 wherein combining the first and second decoded streams into the plurality of combined streams includes storing each combined stream in a separate output buffer.

7. The method of claim 4 further comprising:
   draining the information packets from the combined stream in the output buffer; and,
   wherein storing the combined stream in the output buffer includes storing information packets simultaneously with the draining of information packets from the combined stream.

8. The method of claim 4 further comprising:
   supplying a count of combined stream information packets stored in the output buffer.

9. The method of claim 4 further comprising:
   generating an interrupt signal in response to an action selected from a group consisting of reaching a predetermined output buffer capacity level, storing an end of frame packet, and storing an end of data burst packet.

10. In a portable wireless communications user terminal (UT), a system for parallel path turbo decoding, the system comprising:
    a demultiplexer having an input to accept a coded stream having a first order of information packets, an output to supply a first coded stream of demultiplexed information, and an output to supply a second coded stream of demultiplexed information;
    a first turbo decoder having an input to accept the first coded stream and an output to supply a first decoded stream of information;
    a second turbo decoder having an input to accept the second coded stream, and an output to supply a second decoded stream of information, asynchronously generated with respect to the first decoded stream;
    a clock having outputs to selectively supply a first clock signal and a second clock signal wherein the first turbo decoder decodes the first coded stream in response to receiving the first clock signal, the second turbo decoder decodes the second coded stream in response to receiving the second clock signal; and the clock is configured to at least one of interrupt the supply of the first clock signal in response to the demultiplexer ceasing to supply the first coded stream, and interrupt the supply of the second clock signal in response to the demultiplexer ceasing to supply the second coded streams; and, a multiplexing module having input to accept the first and second decoded streams, the multiplexing module combining the first and second decoded streams and having an output to supply a combined stream having the first order of decoded information packets.

11. The system of claim 10 wherein the multiplexing module includes:

a first mini buffer having an input to accept the first decoded stream and an output to supply a first buffered stream;

a second mini buffer having an input to accept the second decoded stream and an output to supply a second buffered stream; and, a multiplexer having inputs to accept the first and second buffered streams and an output to supply the combined stream.

12. The system of claim 11 wherein the multiplexing module further includes an output buffer having an input to accept the combined stream and an output to supply a buffered combined stream.

13. The system of claim 12 wherein the demultiplexer accepts the coded stream as a superframe with a plurality of frames, where each frame includes ordered information packets; and, wherein the multiplexer modules further includes:

a multiplexer for each frame category, each multiplexer having inputs to accept the first and second buffered streams and an output to supply combined stream of ordered information packets for a corresponding frame category; and, an output buffer for each frame category, each output buffer having an input to accept a combined stream and an output to supply a buffered combined stream for a corresponding frame category.

14. The system of claim 12 wherein the output buffer supplies packets from the buffered combined stream simultaneously with loading packets from the combined stream.

15. The system of claim 12 wherein the output buffer has an output to supply a count of decoded information packets stored in the output buffer.

16. The system of claim 10 wherein the demultiplexer accepts the coded stream as a superframe with a plurality of frames, where each frame includes ordered information packets; and, wherein the multiplexer module supplies a plurality of combined streams, where each combined stream includes ordered information packets corresponding to a frame category.

17. In a portable wireless communications user terminal (UT), a system for parallel path turbo decoding, the system comprising:

a demultiplexer having an input to accept a coded stream having a first order of information packets, an output to supply a first coded stream of demultiplexed information, and an output to supply a second coded stream of demultiplexed information;

a first turbo decoder having an input to accept the first coded stream and an output to supply a first decoded stream of information;

a second turbo decoder having an input to accept the second coded stream, and an output to supply a second decoded stream of information, asynchronously generated with respect to the first decoded stream;

a multiplexing module having input to accept the first and second decoded streams, the multiplexing module combining the first and second decoded streams and having an output to supply a combined stream having the first order of decoded information packets, wherein the multiplexing module further includes an output buffer having an input to accept the combined stream and an output to supply a buffered combined stream;

a first mini buffer having an input to accept the first decoded stream and an output to supply a first buffered stream;

a second mini buffer having an input to accept the second decoded stream and an output to supply a second buffered stream;

a multiplexer having inputs to accept the first and second buffered streams and an output to supply the combined stream; and wherein the output buffer has an output to supply an interrupt signal in response to an action selected from a group consisting of reaching a predetermined output buffer capacity level, storing an end of frame packet, and storing an end of data burst packet.

18. In a portable wireless communications user terminal (UT), a non-transitory computer readable medium encoded with a computer program comprising instructions executable by a digital processing apparatus to perform operations for parallel path turbo decoding, the operations comprising:

accepting a coded stream having a first order of information packets;

demultiplexed the coded stream into first coded and second coded information streams;

turbo decoding the first coded stream, generating a first decoded information stream;

turbo decoding the second coded stream, generating a second decoded information stream, asynchronously with respect to the first decoded stream;

combining the first and second decoded streams into a combined stream having the first order of decoded information packets; and selectively supplying a clock signal to enable at least the turbo decoding of the first coded stream, wherein the clock signal is supplied when the first coded stream having information packets to be decoded is supplied and is interrupted when the first coded stream is not supplied.

19. In a portable wireless communications user terminal (UT), a processor device for parallel path turbo decoding, the processor device comprising:

a demultiplexer module having an input to accept a coded stream having a first order of information packets, an output to supply a first coded stream of demultiplexed information, and an output to supply a second coded stream of demultiplexed information;

a first turbo decoder module having an input to accept the first coded stream and an output to supply a first decoded stream of information;

a second turbo decoder module having an input to accept the second coded stream, and an output to supply a second decoded stream of information, asynchronously generated with respect to the first decoded stream;

a multiplexing module having an input to accept the first and second decoded streams, the multiplexing module combining the first and second decoded streams and having an output to supply a combined stream having the first order of decoded information packets; and a clock configured to selectively supply a clock signal to enable at least the first turbo decoder module, wherein the clock signal is supplied when the first coded stream having information packets to be decoded is supplied by the demultiplexer module and is interrupted when the first coded stream is not supplied by the demultiplexer module.

* * * * *